United States Patent [19]
Meyer

[11] Patent Number: 5,541,595
[45] Date of Patent: Jul. 30, 1996

[54] VARIABLE LENGTH CODE DECODER FOR SIMULTANEOUS DECODING THE MOST SIGNIFICANT BITS AND THE LEAST SIGNIFICANT BITS OF A VARIABLE LENGTH CODE

[75] Inventor: Edwin R. Meyer, Bensalem, Pa.

[73] Assignee: Matsushita Electric Corporation of America, Secaucus, N.J.

[21] Appl. No.: 246,115

[22] Filed: May 19, 1994

[51] Int. Cl.[6] .............................. H03M 7/40; H03M 7/42
[52] U.S. Cl. ................................................ 341/67; 341/65
[58] Field of Search ................................. 341/65, 67, 106

[56] References Cited

U.S. PATENT DOCUMENTS

| | | | |
|---|---|---|---|
| 4,616,211 | 10/1986 | Ross et al. | 341/67 |
| 5,126,738 | 6/1992 | Sasaki | 341/67 |
| 5,138,316 | 8/1992 | Konishi | 341/67 |
| 5,181,031 | 1/1993 | Tong et al. | 341/65 |
| 5,254,991 | 10/1993 | Ruetz et al. | 341/65 |
| 5,394,144 | 2/1995 | Kim | 341/67 |
| 5,428,356 | 6/1995 | Ozaki | 341/67 |

OTHER PUBLICATIONS

D. Luthi, P. Tong, P. Ruetz, "*A Video–Rate JPEG Chip Set*", IEEE Custom Integrated Circuits Conference, 1992.

S. Lei, M. Sun, "*An Entropy Coding System for Digital HDTV Applications*", IEEE Transactions on Circuits and Systems For Video Technology, vol. 1, No. 1, Mar. 1991.

*Primary Examiner*—Marc S. Hoff
*Attorney, Agent, or Firm*—Ratner & Prestia

[57] ABSTRACT

A variable length decoder for decoding a variable length code. The variable length decoder includes a first look-up table for receiving and decoding the most significant bits of the variable length code and for producing a first decoded code corresponding to the most significant bits. The first look-up table means also for outputs a conversion signal. In addition, a second look-up table is provided for receiving and decoding the least significant bits and for producing a second decoded code corresponding to the least significant bits. The first look-up table and the second look-up table decode the most significant bits and the least significant bits at substantially the same time. The decoded output of the look-up tables is provided to a selector. The selector selects the first decoded code or the second decoded code based upon the conversion signal.

12 Claims, 14 Drawing Sheets

FIG. 5

VARIABLE LENGTH CODE DECODER FOR SIMULTANEOUS DECODING THE MOST SIGNIFICANT BITS AND THE LEAST SIGNIFICANT BITS OF A VARIABLE LENGTH CODE

The present invention relates to a variable length code decoding decoder and, in particular, to a variable length code decoder suited for decoding compressed image data.

BACKGROUND OF THE INVENTION

Recently, some remarkable progress has been made in image data compression techniques. The goal of these techniques is to raise the efficiency of, for example, digital transmission and recording by encoding the image data at a lower bit rate than would be required for unencoded image data. Exemplary techniques which have been used to obtain these coding efficiencies are predictive coding and transform coding.

In addition, further image data compression can be achieved by performing variable length encoding on the compressed code. The variable length encoding consists of varying the encoded bit width in accordance with the frequency of occurrence of the value to be encoded. Thus, a smaller bit rate can be obtained as compared to fixed length coding. One example of a variable length code is a Huffman code.

Next, as an example of variable length coding, a description is given with reference to FIGS. 7a and 7b of a method for generating Huffman codes. Assume that the fixed length data values $S_1 S_1, \ldots S_t$ are to be converted into Huffman codes. FIGS. 7a and 7b show an example for the case where $t=6$. First of all, codes $S_1$ to $S_6$ are arranged in order of the magnitude of the frequency of their occurrence (these magnitudes can be normalized to obtain the probabilities of occurrence). The probabilities of occurrence of codes $S_1$ to $S_6$ are respectively 0.35, 0.20, 0.15, 0.15, 0.10 and 0.05 as shown in FIG. 7a. They are therefore arranged in order of codes $S_1$ to $S_6$. Next, taking the two codes which have the smallest probability of occurrence as one group, their composite probability (the sum of the two probabilities of occurrence) is found.

In FIG. 7a, codes $S_6$ and $S_5$ have the smallest probability of occurrence, and their composite probability is 0.15. Next, this group and the other codes are arranged in order of magnitude of their probabilities of occurrence for composite probability. The two codes (or groups) having the smallest probability of occurrence (or composite probability) are taken as a new group, and the composite probability of this group is found. Subsequently, this process is repeated until a listing with the composite probability of one has been effected as shown in FIG. 7a.

Next, using FIG. 7a, a code tree as shown in FIG. 7b is compiled. "0" and "1" are then allocated in accordance with the branching of this code tree. In FIG. 7b, the upper branches are allocated "0", while the lower branches are allocated "1". The Huffman codes are obtained by following this branching. For example, as shown by the thick line in FIG. 7b, the fixed length code $S_4$ passes along a branch "0", along a branch "1", and finally along a branch "0", so it is converted to the Huffman code "010". The Huffman codes of the codes $S_1$ to $S_6$ found in this way are shown in Table one below.

TABLE 1

| CODE | Huffman Code |
|---|---|
| $S_1$ | 00 |
| $S_2$ | 10 |
| $S_3$ | 11 |
| $S_4$ | 010 |
| $S_5$ | 0110 |
| $S_6$ | 0111 |

As shown in Table one, codes which have high probability of occurrence are converted into Huffman codes of short bit length, while codes which have a low probability of occurrence are converted into Huffman codes of longer bit length. In this way, the overall bit rate for transmitting a given number of data values can be reduced.

In general, to decode such variable length code into fixed length code, a conversion table, embedded in a solid state memory such as a ROM, is used. In FIG. 7a, for convenience in explanation, the maximum bit number of the variable length code (Huffman code) was taken as being four bits, in an actual image data signal, the maximum bit number may be larger, for example, 17 bits.

For example, one prior art method for decoding the variable length is shown in FIG. 11. A n-bit parallel data signal is coupled to a look-up table (LUT) 111. The n-bit signal contains a variable length code word which is used as an address for data stored in LUT 111. The variable length code may be n bits in length. The data stored in LUT 111 corresponds to the code length and the code value. The code length data specifies the length of the variable length code word that has been identified in the n-bit signal. The code value is the decoded (i.e. fixed length) value of the variable length code. The output of LUT 111 is code length and code value which are z-bit and v-bit parallel data streams respectively.

In operation, the variable length code received in the n-bit signal is used as an address to a memory location in LUT 111. After the memory location has been identified, the LUT outputs code length and code value which are stored at the memory location.

However, the prior art device of FIG. 11 requires a large memory because an n-bit address must be provided as an input to LUT 111. In addition, each memory location in LUT 111 stores an z-bit code length and a v bit code value. As a result, a total of z+v bits are needed to store code length and the code value. The total number of bits required for LUT one is $2^n*(z+v)$.

Accordingly, proposals have been made to limit the size of the conversion tables to reduce the required memory size for the conversion table. However, these techniques have resulted in a slower decoding process.

For example, one such apparatus was proposed in U.S. Pat. No. 5,138,316, entitled VARIABLE LENGTH CODE DEMODULATING APPARATUS AND ADDRESS CONTROL METHOD THEREOF, issued to Konishi (hereinafter '316 patent), shown in FIG. 10 and incorporated herein by reference for its teachings on decoders for variable length codes. The '316 patent describes a variable length code in which the most significant bits (MSBs) are provided to conversion table 822 and where the least significant bits (LSBs) are provided to conversion table 823. Respective 9 bit output values of each conversion table 822, 823 are coupled to a selector 830. In addition, a five bit output value of conversion table 822 is coupled to the LSB input of conversion table 823. Also a one bit output signal is provided by conversion table 822 to selector 824.

In operation, 15 parallel bits of a variable length encoded bit stream are applied through the input terminal 821. The most significant eight bits of a segment of the bit stream are applied to conversion table 822. The seven least significant bits are provided at the address input terminal of conversion table 823 as the LSBs of a 12 bit address value which also include the 5-bit conversion code from conversion table 822. If a Variable length Code (VLC) value consists of 8 bits or less, then a length code "1" is produced by conversion table 822 to the control terminal 826 of selector 824. Further, the 9-bit fixed length value stored at the address indicated by this variable length code value is provided by conversion table 822 to the first input terminal 828 of the selector 824. Since the selector receives a "1" at its control input terminal 826, it passes the fixed length code applied to the first input terminal 828.

In contrast, if the variable length code value is 9 bits or more, a length code "0" is generated by the conversion table 822. The conversion table 822 also generates the 5-bit conversion code stored at the address corresponding to the most significant 8 bits. Thus, a 12-bit code word is supplied to the address input port of conversion table 823. The address conversion table 823 is thus designated and the 9-bit fixed length code corresponding to the VLC of 9-bits or more is applied to the second input terminal 830 of selector 824.

Although this arrangement reduces the table size, it also reduces the rate at which the VLC can be decoded. This occurs because conversion table 822 first attempts to decode the VLC. However, if conversion table 822 fails to decode the VLC, conversion table 822 must first provide additional bits to conversion table 823 prior to decoding by conversion table 823.

SUMMARY OF THE INVENTION

The present invention relates to an apparatus that reduces the memory size of the table used to decode the VLC without slowing the decoding process. The present invention further relates to reducing the memory size by reducing the number of bits used as an input address for the LUT.

The present invention is embodied in a variable length decoder for decoding a variable length code value which is being held in a n-bit fixed length word. The fixed length word has k least significant bits and m most significant bits where m, n and k are integers and m and k are each less than n. The variable length decoder includes a first conversion table which receives the m most significant bits and which produces a first decoded value corresponding to the m most significant bits. The first conversion table also generates a conversion signal. Also included is a second conversion table for receiving the k least significant bits to produce a second decoded value corresponding to code words which have these k bits as their k least significant bits. The first conversion table and the second conversion table decode the most significant bits and the least significant bits at substantially the same time. Also included is a selector for selecting one of the first decoded code and the second decoded code in response to the conversion signal.

BRIEF DESCRIPTION OF THE DRAWINGS

FIG. 5 is a tree diagram showing a partial code tree suitable for use in the coding standard defined by the Moving Picture Expert's Group (MPEG) of the International Standards Organization (ISO).

FIG. 7a shows the process of generating Huffman codes, and FIG. 3b, shows a Huffman code tree.

DETAILED DESCRIPTION OF THE INVENTION

Figure 1:
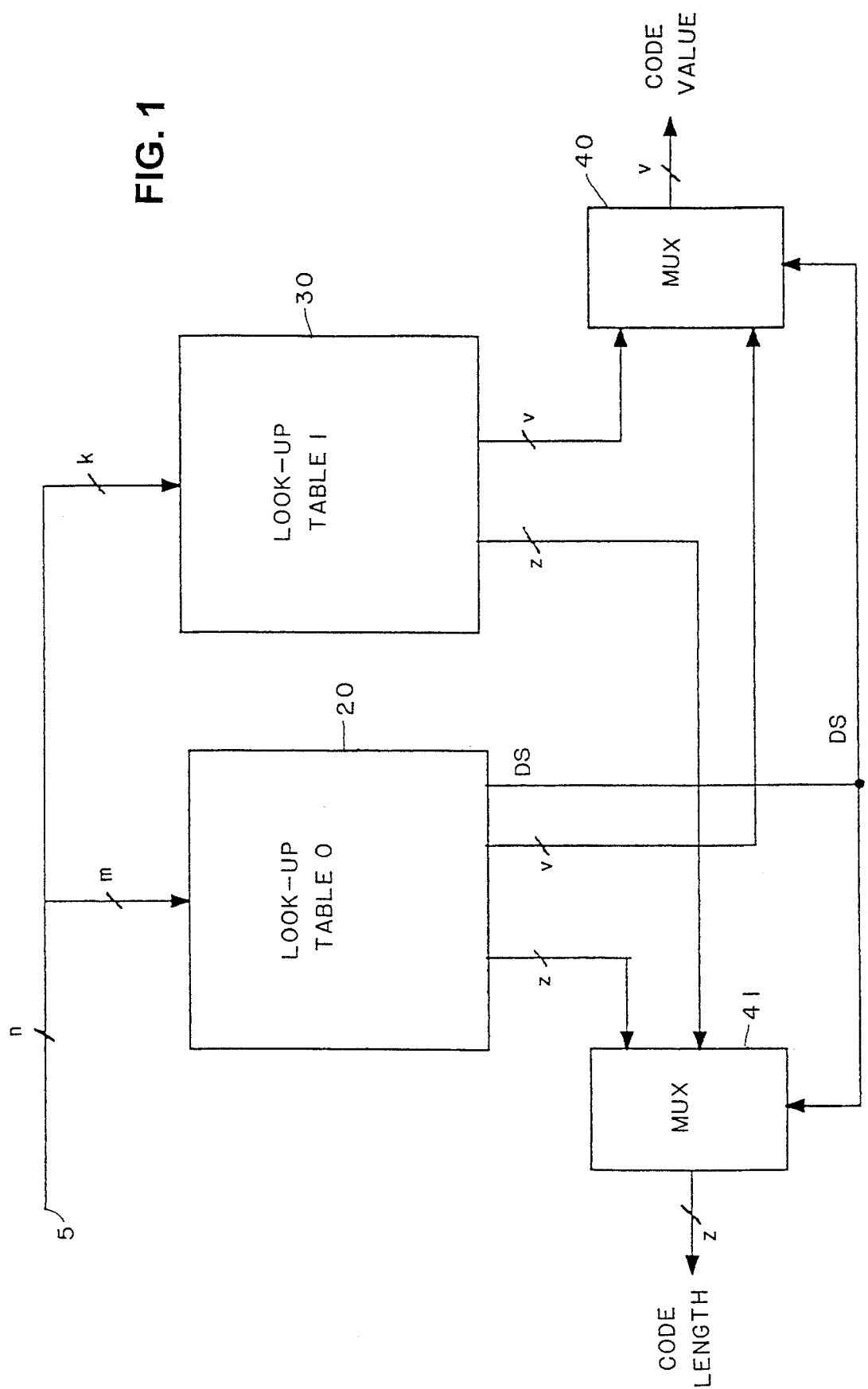
FIG. 1 is a block diagram of a variable length decoder according to the first exemplary embodiment of the present invention.

FIG. 1 shows a variable length decoder according to a first exemplary embodiment of the invention.

At input terminal 5, the decoder receives a segment of a variable length encoded data stream of, for example, n bits. The variable length encoded data is split so that the m MSBs, where m is a natural number and $0<m<=n$, of the variable length code are applied to LUT zero 20. The k LSBs, where k is a natural number and $0<=k<=n$, of the variable length code are applied to LUT one 30. The addresses in LUT zero 20 and LUT one 30 are specified by the bits that are applied at the address input terminal, and the data output values of LUT zero 20 and LUT one 30 are specified by the data stored at the designated address.

The output signal of LUT zero 20 is applied to a first data input port of both multiplexer 40 and multiplexer 41. In addition, a decode signal is also provided by LUT zero 20 to control input terminal of multiplexer 40 and 41. The output signal of LUT one 30 is applied to a second data input port of multiplexer 40 and multiplexer 41.

In operation, the m MSBs and k LSBs are provided to LUT zero 20 and LUT one 30 respectively. Each table decodes the bits provided using the bits as an address within the table and by providing, as its output value, the data stored at that addressed location within the table. In the exemplary embodiment LUT zero 20 and LUT one 30 decode the m MSBs and the k LSBs respectively, at substantially the same time, thus, performing a parallel decoding operation.

The data stored at the address location includes a code length indicating the length of the variable length code and a code value which is the decoded value of the variable length code. The code length and the code value are z and v bit parallel streams.

In addition to providing the data value at the address indicated by the m MSBs, LUT zero 20 also provides a decode signal, DS, to multiplexers 40 and 41 indicating whether table zero 20 has correctly decoded the variable length code word. If the decode signal is "0", then multiplexers 40 and 41 passes the data provided by LUT zero 20. This is done because LUT zero 20 has successfully decoded the variable length code word and thus, it is unnecessary to consider the output of LUT one 30.

If, however, the decode signal is "1", then LUT zero 20 has not successfully decoded the variable length code word. As indicated above, in this instance, LUT one 30 has necessarily decoded the variable length code word because LUT zero 20 has not. Accordingly, multiplexers 40 and 41 passes the data value provided to it by LUT one 30.

Thus, according to the first exemplary embodiment, the variable length decoder is able to reduce the size of the tables needed for conversion while also maintaining decoding speed by using the LUTs in parallel to decode the MSBs and LSBs of the variable length code.

LUT zero 20 and LUT one 30 have m and k corresponding addresses for the m MSBs and k LSBs of the variable length code respectively. The partitioning of the codes tables and the number of most significant bits and least significant bits, m and k, are determined in accordance with a method described below. What is desired is to produce a combination of addresses for LUT zero 20 and LUT one 30 such that the combined table is reduced in size in order to minimize the amount of memory required for the tables.

The method for determining the size of the tables 20 and 30 shown in FIG. 1 is described below with reference to FIGS. 2a–2c, 3a–3c, and 4a–4c.

Figure 7A:
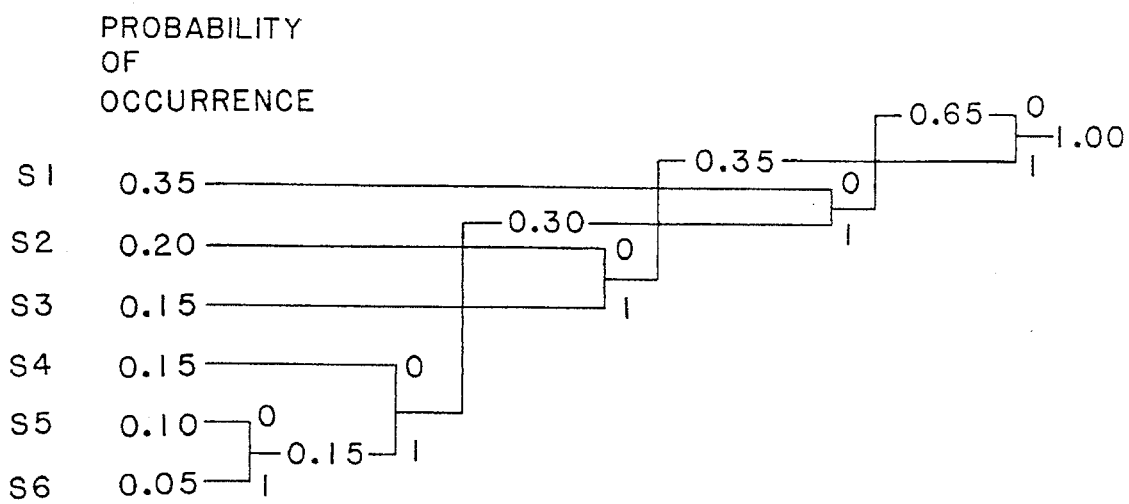
FIGS. 7a and 7b (prior art) are tree diagrams explaining huffman codes, where
Figure 7B:
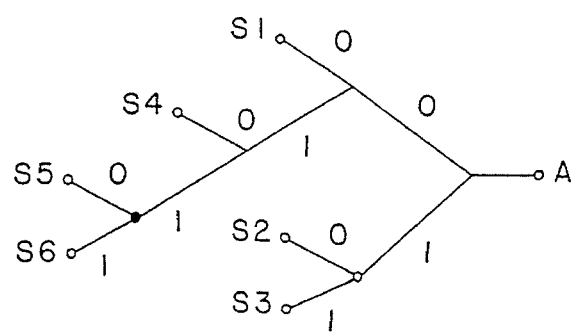

The method uses code trees which correspond to the variable length codes. The correlation between the variable length codes and code trees is illustrated by Table One and FIG. 7b. Table One has variable length codes which my be generated by tracing the branches of the tree shown in FIG. 7b. For example, the variable length code for S5 is generated by tracing the branches from A to S5. The variable length code produced is 0110.

For example, assume that an n-bit code tree is given where n is also the maximum length of the variable length code. If it is assumed that LUT zero 20 has m bits, as noted above, the minimum size k of table one 30 can be determined as follows.

First, k is set equal to n minus m (k=n–m). Then a level for the main tree is calculated as n minus k (n–k). For example, consider FIG. 2a, level two is the tree level corresponding to leaf nodes 00 and 10. A higher level, for example level one, is the tree level corresponding to branch nodes zero and one. A tree level may have subtrees below the level. For example, level two of FIG. 4a has one subtree. The subtree is below branch node 00 with two branches having two leaf nodes 000 and 001. For each tree and subtree a corresponding LUT may be generated. The LUT for a respective tree or subtree uses the variable length codes at the leaf nodes of the respective tree or subtree as addresses in memory.

The inventor has determined that generally the lowest possible value of k for LUT one which will both (1) decode the variable length code in combination with LUT zero and (2) produce the minimum combined table size, is k=n–m. However, in some instances, k can be smaller. In this instance, the code tree should not be pruned, as explained below, until the level of k=n–m is reached and selected for splitting the code tree.

It can be determined if a variable length code can be decoded by LUT one having k LSBs and LUT zero having m MSBs by combining subtrees at level n–k of the main tree which correspond to the tables respectively. If the subtrees can be combined without overlap, then LUT one having k LSBs and LUT zero having m MSBs will decode the variable length code.

Figure 2C:
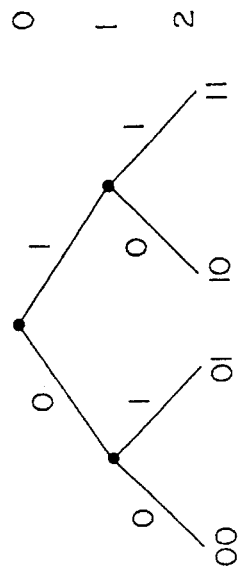
FIGS. 2a–2c are tree diagrams showing a example of how code trees are combined.
Figure 2B:
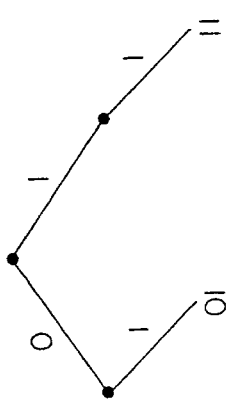
Figure 2A:
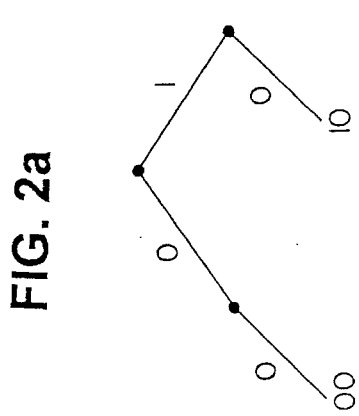

For example, if the subtrees shown in FIGS. 2a and 2b are combined, then the tree in FIG. 2c is produced. This is accomplished by combining the different subtrees and the subtrees' corresponding leaf nodes of the main tree shown in FIGS. 2a and 2b. Alternatively, the combination of the two subtrees may be performed by laying one tree on top of the other tree.

Figure 3A:
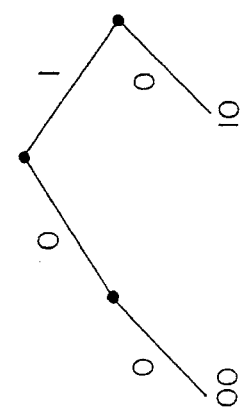
FIGS. 3a–3c are tree diagrams showing another example of how code trees are combined.
Figure 3B:
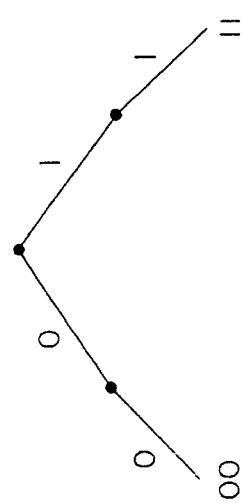
Figure 3C:
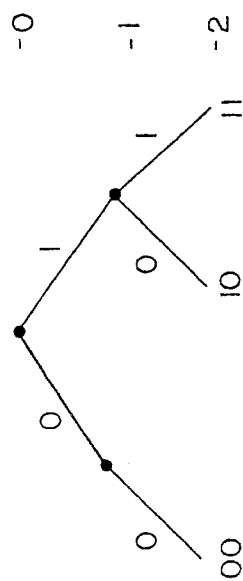

If the leaf nodes of FIG. 2a at level two do not overlap with the leaf nodes of FIG. 2b, then the combination of the subtrees is valid. As a result, k, where k has been set equal to n–m, would be minimized. If, however, as shown in FIGS. 3a, 3b, and 3c, subtrees are combined, and an overlap at leaf node 00 occurs, then leaf node 00 is not unique to either of the subtrees shown in FIG. 3a and 3b, and the split shown in FIGS. 3a and 3b may not be used.

Figure 4A:
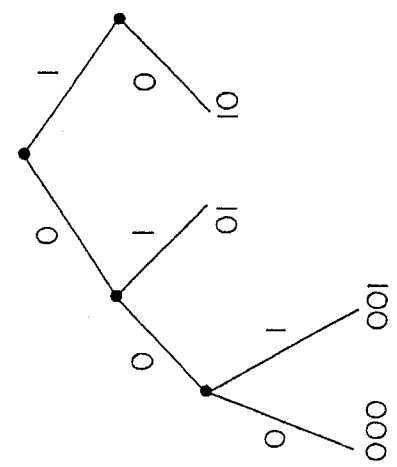
FIGS. 4a–4c are tree diagrams showing another example of how code trees are combined.
Figure 4B:
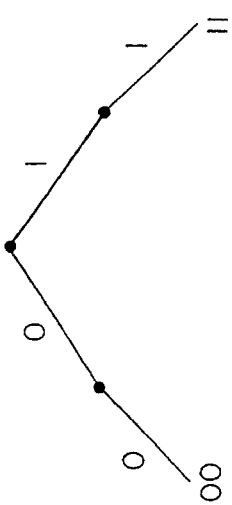
Figure 4C:
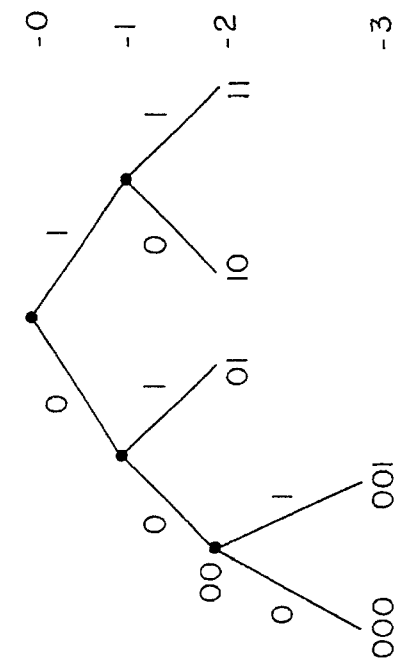

Another improper combination is illustrated in FIGS. 4a–4c. Here, FIG. 4a contains an additional leaves at level three. When the subtrees of FIGS. 4a and 4b are combined, it is not possible to distinguish the leaf nodes at level three because the leaf nodes at level two of the subtree shown in FIG. 4b includes a leaf node which makes the level three leaf nodes shown in FIG. 4a not unique.

Multiple trees may be combined by first combining two subtrees to produce a new tree and then by combining the next subtree with the new tree. This, process may be repeated if additional trees are provided.

If the branches at level n minus k (n–k) can not be combined, then the next level, (n–k)+1 or n–k' where k'=k'–1, is tested. Prior to combining at the n–k' level, all of the leaves at the n–k level are pruned (removed). Then, the main tree is divided into subtrees at the n–k' level.

For example, if a level two split does not work, the leaf nodes at level two are pruned and then the main tree is split at level one. Then, the subtrees at level one are combined. The method for combining subtrees at the next level, n–k', is same as the method used to combine the subtrees at the n–k level.

This process is repeated until the main tree is split into subtrees which may be combined. The first value of k which produces a valid split is the lowest value of k which will produce a combined table which uses a smaller amount of memory than a single table that processes n bits in parallel.

Using this method, a LUT may be split into a smaller primary and secondary LUTs where each of the smaller tables corresponds to a subtree which may be combined with the other subtrees to produce a tree that corresponds to the original LUT. In addition, the minimum table size for the secondary tables may be determined. Further, to minimize the overall size of the primary table and the secondary table, the minimum of $2^m + 2^k$, where m is the bit length for the primary table and k is the bit length for the secondary table, is calculated. The minimum value may be determined by calculating different values of k for different values of m.

Figure 5:
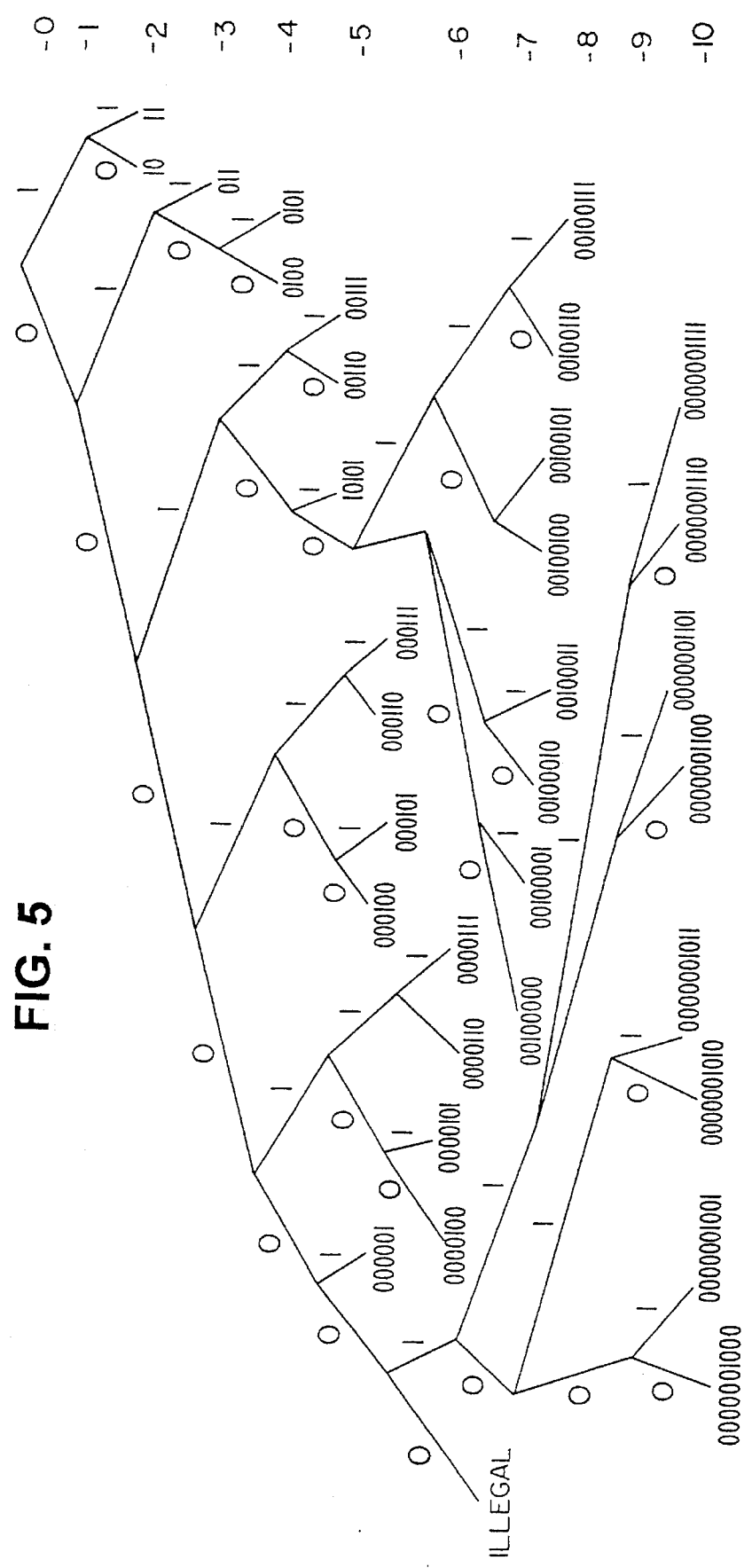

For example, consider the partial MPEG tree shown in FIG. 5. FIGS. 6a–6g show examples of different combinations of m and k for LUT zero 20 and LUT one 30 assuming that the maximum length of the variable length code is only 10 bits.

Figure 6A:
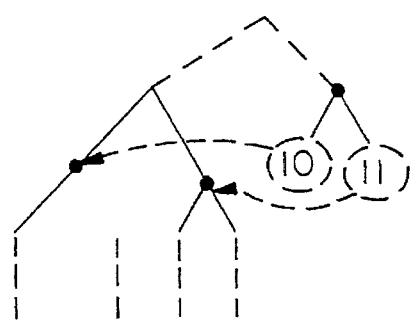
FIGS. 6a–6g are tree diagrams showing how the code tree of FIG. 5 is divided into lower level code trees to produce smaller conversion tables.

FIG. 6a shows the case where m for LUT 20 is one bit and k for LUT one 30 is 9 bits. When the two subtrees corresponding to the two tables are combined the tree in FIG. 6a is produced. However, leaves 10 and 11 overlap when the trees are combined. Thus the subtrees can not be combined.

Figure 6B:
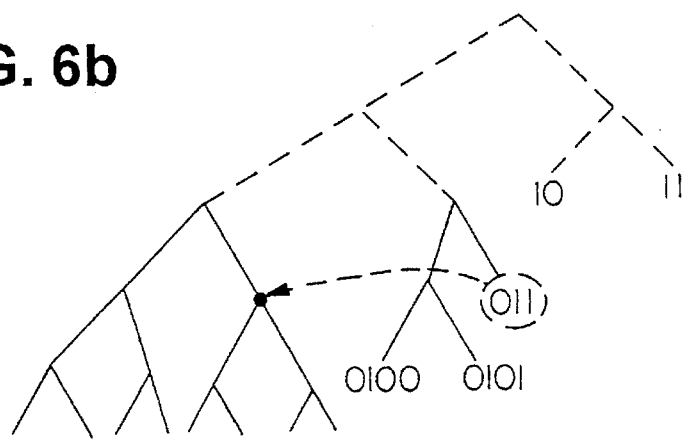

FIG. 6b shows the case where m is two bits and k is 8 bits. This combination is also improper because leaves 01 and 00 conflict.

Figure 6C:
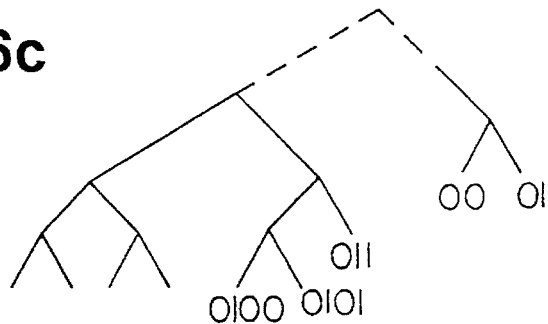
Figure 6D:
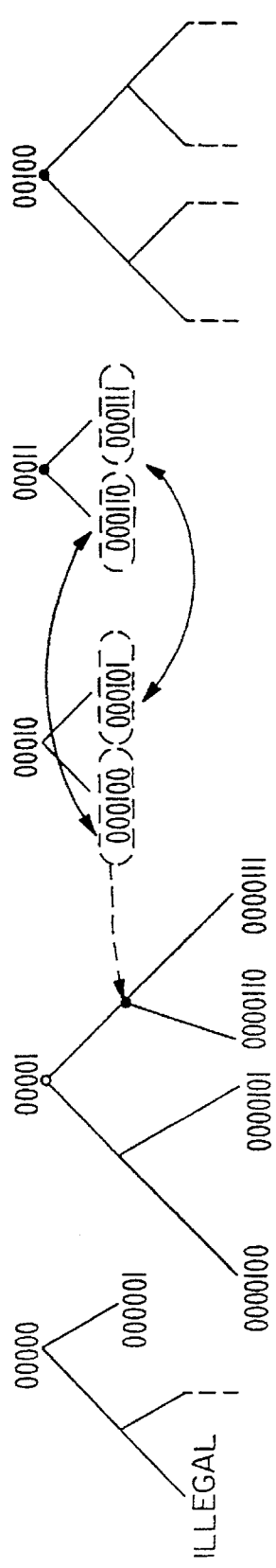
Figure 6E:
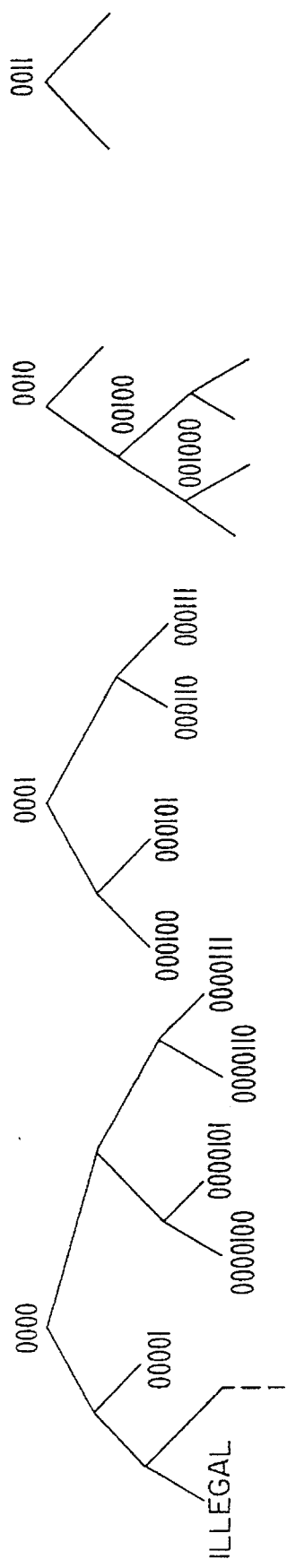
Figure 6F:
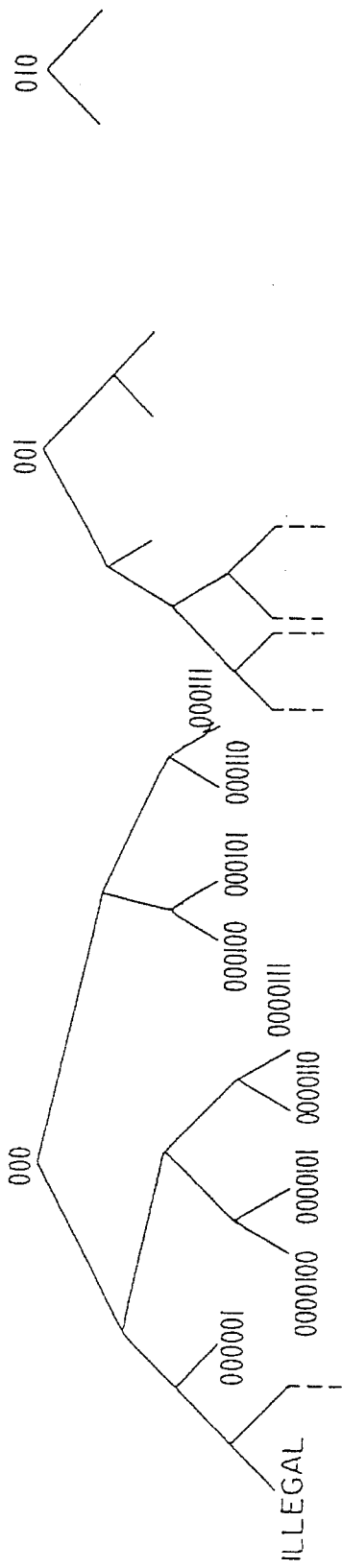
Figure 6G:
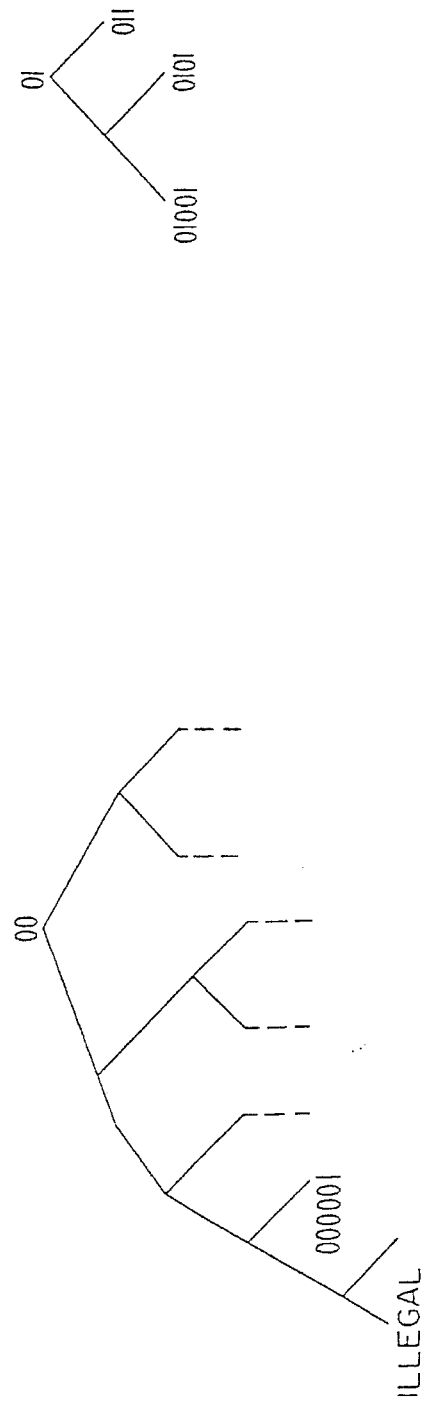

FIG. 6c shows the case where m is two bits and k is 9 bits. As shown, a conflict does not exist when the trees corresponding to the tables are combined. Therefore, a valid split of the table has been performed.

This process is repeated in FIGS. 6d–6g for different combinations of m and k bits. The splits shown in FIGS. 6d, 6e, and 6f can not be combined. However, the split shown in FIG. 6g may be successively combined.

By iteratively performing the above method of combining subtrees for different values of m and k it is possible to arrive at Table two below which lists combinations of m and k bits for tables that produce valid combinations. In Table two, the first column represents the number of m bits for LUT zero 20 and the second column shows a corresponding number of k bits for LUT one 30. The third column shows the combined table size using different combinations of m and k in column one and two of table two.

TABLE 2

| TABLE ZERO (Bits) | TABLE ONE (Bits) | MEMORY SIZE (in words) |
| --- | --- | --- |
| 1 | 10 | 1026 |
| 2 | 9 | 516 |
| 3 | 9 | 520 |
| 4 | 8 | 272 |
| 5 | 8 | 288 |
| 6 | 8 | 320 |
| 7 | 8 | 384 |
| 8 | 3 | 264 |
| 9 | 3 | 520 |
| 10 | 0 | 1024 |

The table size is determined using the formula $2^m + 2^k$. For example, where m=3 and k=9, the memory size is $2^3 + 2^9 = 520$. The combination of m and k which produces the minimum table size is m=8 and k=3.

For this implementation the codes defined in the tree for level three and below are in one table, the secondary table, and the codes for the first eight levels of the trees are in another table, the primary table.

Next, for consider the code tables B-14 and B-15 defined in the MPEG-2 standard, proposed by the Moving Picture Experts Group (MPEG) of the International Standards Organization (ISO). This standard is described in a draft internal standard (DIS) publication entitled "Information Technology—Generic Coding of Moving Pictures and Associated Audio, Recommendation H.626" ISO/IEC 13818-2 DIS, 3/94 which is available from the ISO and which is hereby incorporated by reference for its teaching on the MPEG-2 digital video encoding standard. In this code table, variable length code words having a maximum size of 17 bits are to be decoded. Tables three and four below show the split of a 17 bit segment of the bit stream of LUT zero 20 and LUT one 30 for providing the most significant bits and the least significant bits to the respective tables for decoding the variable length code word. The proposed MPEG standard has two tables, "DCT Coefficient Table Zero" and "DCT Coefficient Table One" corresponding to two sets of discrete cosine transform DCT coefficients. Table three shows the split for "DCT Coefficient Table Zero" and Table four shows the split for "DCT Coefficient Table One".

TABLE 3

(Combinations for DCT Coefficient Table Zero for MPEG-2)

| MSB's bit width | LSB's bit width | Redundant bit width | Total table size |
| --- | --- | --- | --- |
| 6 | 15 | 4 | 32832 |
| 7 | 15 | 5 | 32896 |
| 8 | 15 | 6 | 33024 |
| 9 | 11 | 3 | 2560* |
| 11 | 10 | 4 | 3072 |
| 13 | 9 | 5 | 8704 |

TABLE 4

(Combinations for DCT Coefficient Table One for MPEG-2)

| MSB's bit width | LSB's bit width | Redundant bit width | Total table size |
| --- | --- | --- | --- |
| 8 | 15 | 6 | 33024 |
| 9 | 11 | 3 | 2560* |
| 10 | 11 | 4 | 3072 |
| 11 | 10 | 4 | 3072 |
| 13 | 9 | 5 | 8704 |

As can be seen from Tables three and 4, an optimum table size of 2560 can be obtained for "DCT Coefficient Table Zero" and for "DCT Coefficient Table One". Optimization limits the amount of memory required to implement the tables while ensuring that the variable length code is accurately and rapidly decoded.

Thus, a variable length code may be decoded using parallel LUTs which results in reduced memory usage and high speed decoding.

Second Exemplary Embodiment

Figure 9:
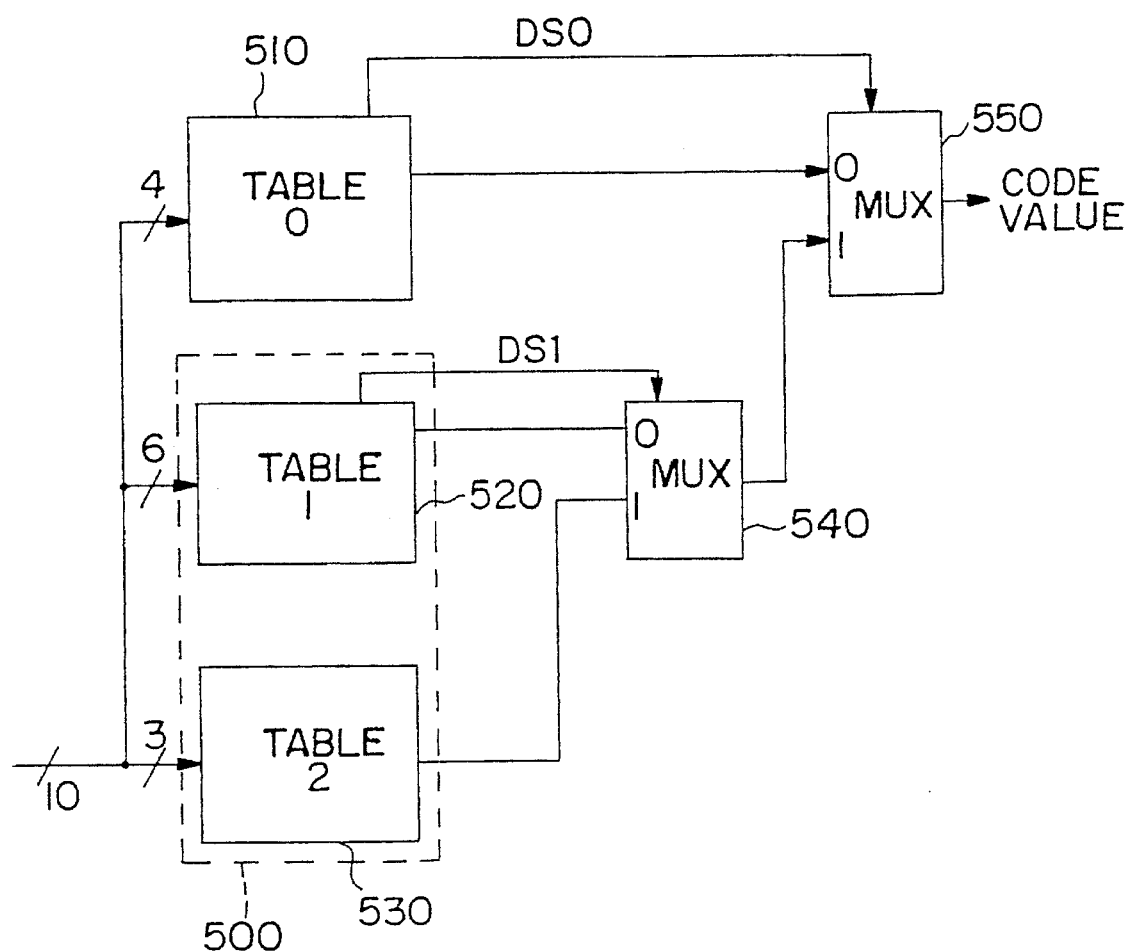
FIG. 9 is a block diagram of a variable length decoder according to the second exemplary embodiment of the present invention.
Figure 10:
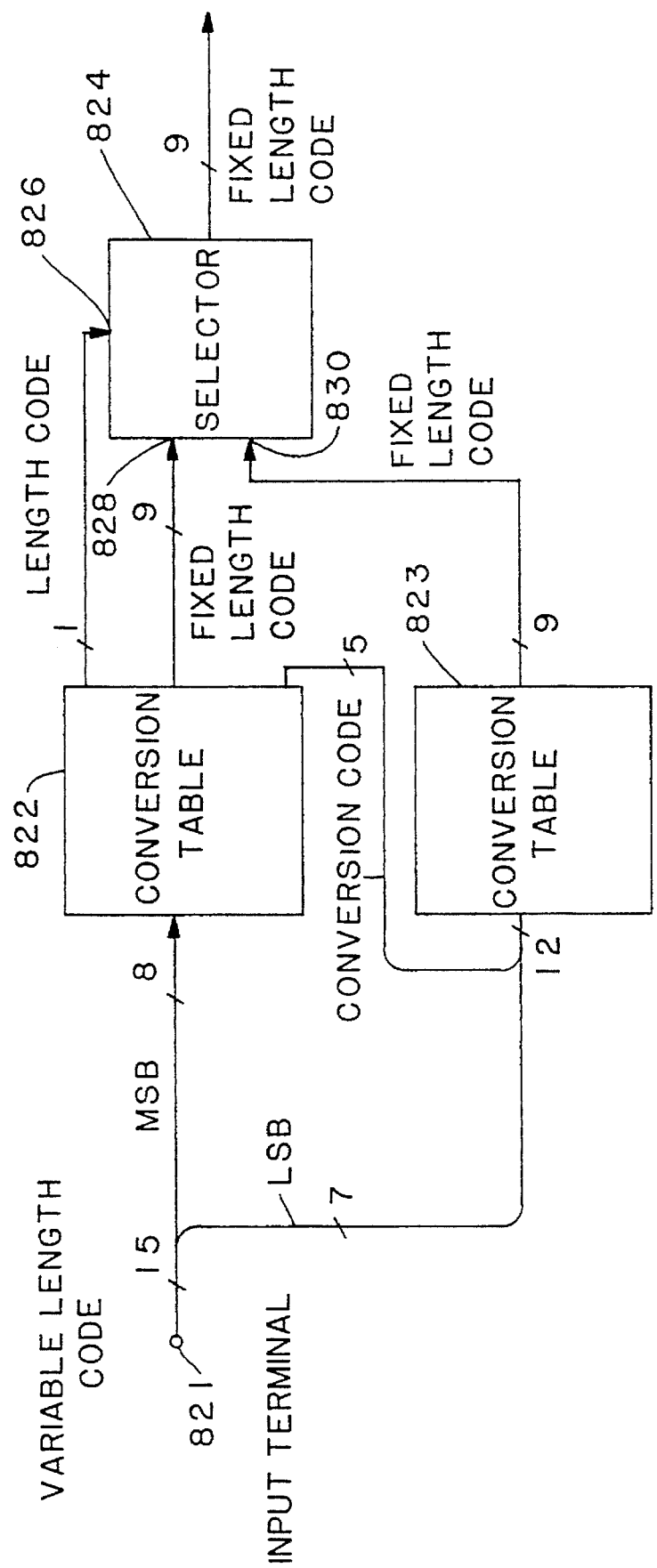
FIG. 10 (prior art) is a block diagram of a conventional variable length code demodulating apparatus.

FIG. 9 shows a second exemplary embodiment of the present invention. The second exemplary embodiment shows the case where the code tables have been divided into three separate code tables. A separate output for code length is not shown for simplicity of explanation.

A 10-bit segment of an input data stream is coupled to LUT 510, LUT 520, and LUT 530. A data output value of LUT 510 is coupled to a first data input port of a multiplexer 550. In addition, a control output signal, DS0, from LUT 510 is coupled to a control input terminal of the multiplexer 550. A data output value of LUT 520 is coupled to a second data input port of the multiplexer 540. Further, a control output signal, DS1, from LUT 520 is also coupled to multiplexer 540 and a data output value of table 530 is coupled to multiplexer 540. The output value provided by multiplexer 540 is in turn coupled to LUT 550.

The size of LUTs 510, 520, 530 are determined using a method similar to the one used in the first exemplary embodiment.

First, the initial table is divided into a primary LUT 510 and a secondary LUT 500. The size of each table is determined using the same method described above in the first exemplary embodiment. Then, once the size of the primary LUT 510 and the secondary LUT 500 have been determined, the secondary table 500 is split into two more LUTs 520, 530. The same process is used to determine the optimal table size for the two new tables. LUT 520 is the primary table and table 530 is the secondary table. Thus, the method used the first exemplary embodiment may be used to determine the size of the two new LUTs 520, 530. Tables 5, 6, and 7 below illustrate the iterative process.

Table 5 shows the iterative process for deriving LUTs 510 and 500. Tables 6 and 7 show the process to derive LUT 520 and LUT 530. For Table 6, the table size for LUT 500 is nine bits. Thus, LUTS 520 and 530 are split to decode an 9-bit code word. For Table 7, the table size for LUT 500 is eight bits. Thus, LUTS 520 and 530 are split to decode an 8-bit code word.

TABLE 5

| TABLE A (Bits) | TABLE B (Bits) | MEMORY SIZE (in words) |
| --- | --- | --- |
| 1 | 10 | 1026 |
| 2 | 9 | 516 |
| 3 | 9 | 520 |
| 4 | 8 | 272 |
| 5 | 8 | 288 |
| 6 | 8 | 320 |
| 7 | 8 | 384 |
| 8 | 3 | 265 |
| 9 | 3 | 520 |
| 10 | 0 | 1024 |

TABLE 6

(Assuming Table B is nine bits)

| TABLE B' (Bits) | TABLE C (Bits) | MEMORY SIZE (in words) |
| --- | --- | --- |
| 1 | 9 | 514 |
| 2 | 9 | 516 |
| 3 | 9 | 520 |
| 4 | 8 | 272 |
| 5 | 8 | 288 |
| 6 | 8 | 320 |
| 7 | 3 | 136 |
| 8 | 3 | 264 |
| 9 | 0 | 512 |

TABLE 7

(Assuming Table B is eight bits)

| TABLE B' (Bits) | TABLE C (Bits) | MEMORY SIZE (in words) |
| --- | --- | --- |
| 1 | 8 | 258 |
| 2 | 8 | 260 |
| 3 | 8 | 265 |
| 4 | 8 | 272 |
| 5 | 8 | 284 |
| 6 | 3 | 72 |
| 7 | 3 | 136 |
| 8 | 0 | 256 |

Thus, it is possible to divide a LUT into multiple LUTs to minimize the required size for the LUTs. The size of the LUTS is determined by adding together the Table sizes of Tables A, B' and C. This process may be repeated iteratively to divide a LUT into a greater number of LUTs than that shown in the third exemplary embodiment.

Although the division of a LUT into multiple LUTs is discussed with regard to decoding MPEG encoded variable length code words, this process can be applied to any number of fields in which LUTs are utilized to represent tree data structures.

Third Exemplary Embodiment

The third exemplary embodiment is described with reference to FIG. 12. According to the third exemplary embodiment, a separate code length table is used to determine the code length of the variable length code.

Figure 12:
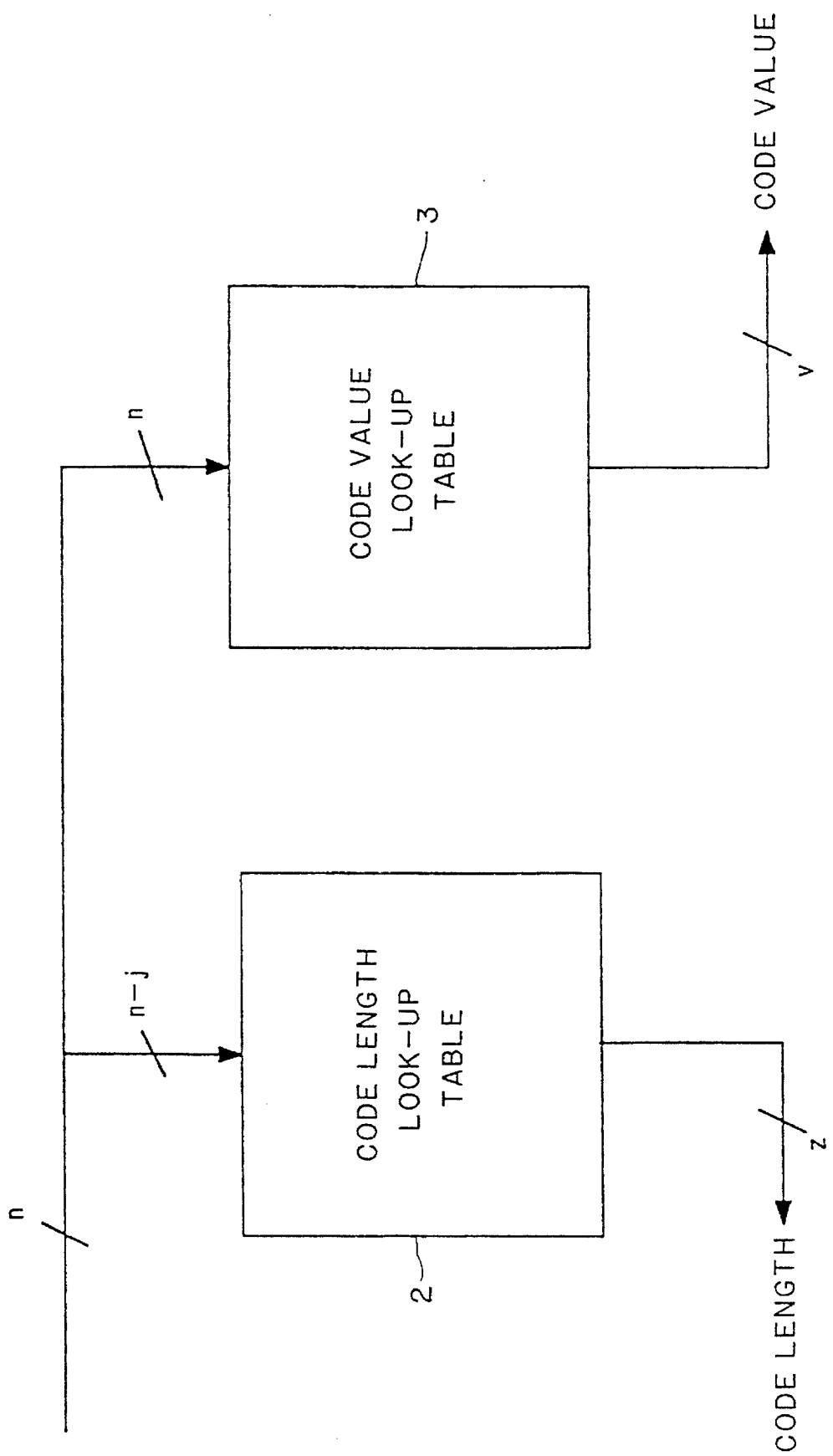
FIG. 12 is a block diagram of a variable length decoder according to the third exemplary embodiment of the present invention.

As shown in FIG. 12, an n-bit input stream is provided to code value LUT 3. Code value LUT provides a decoded value of the variable length code contained in the n-bit input stream. In addition, n minus j (n–j) bits of the n-bit input stream are provided to code length LUT 2. The separate code length LUT is used to determine the code length of a variable length code contained in the n-bit input stream.

In operation, a segment (n–j) of the n-bit input stream is provided to code length LUT 2. The entire n-bit input stream is provided to code value LUT 3 to recover the data values from the variable length code from the bit stream. The code value LUT 3 does not store the code length of the variable length code.

As described below, the code length is used to separate the variable length encoded value from the subsequent variable length encoded values in the n-bit input stream. Further, as described below, by using a separate code length table, it is possible to reduce the overall size of the memory required for decoding the variable length code. This results because the code value LUT does not have to include both the code value and its corresponding code length. Thus, the number of bits stored in the code value LUT at an address may be reduced.

The code length LUT 2 uses the n–j bits of the n-bit stream as an address in memory. The bits located at that address specify the length of the code. A corresponding address for each variable length code does not have to be provided because some of the variable length codes have the same length. Accordingly, an address is provided and a corresponding length is stored in memory for each of the different lengths of the variable length codes.

Code value LUT 3 uses the n-bit steam as an address in memory. Stored at the address in memory is a code value for the variable length code. However, the length of the variable length code may not be stored in the memory of code value LUT 3 because it is stored in the memory of code length LUT 2. As a result of using both code length LUT 2 and code value LUT 3 to decode code length and the code value respectively, it is possible to reduce the required memory used for look up tables.

Figure 11:
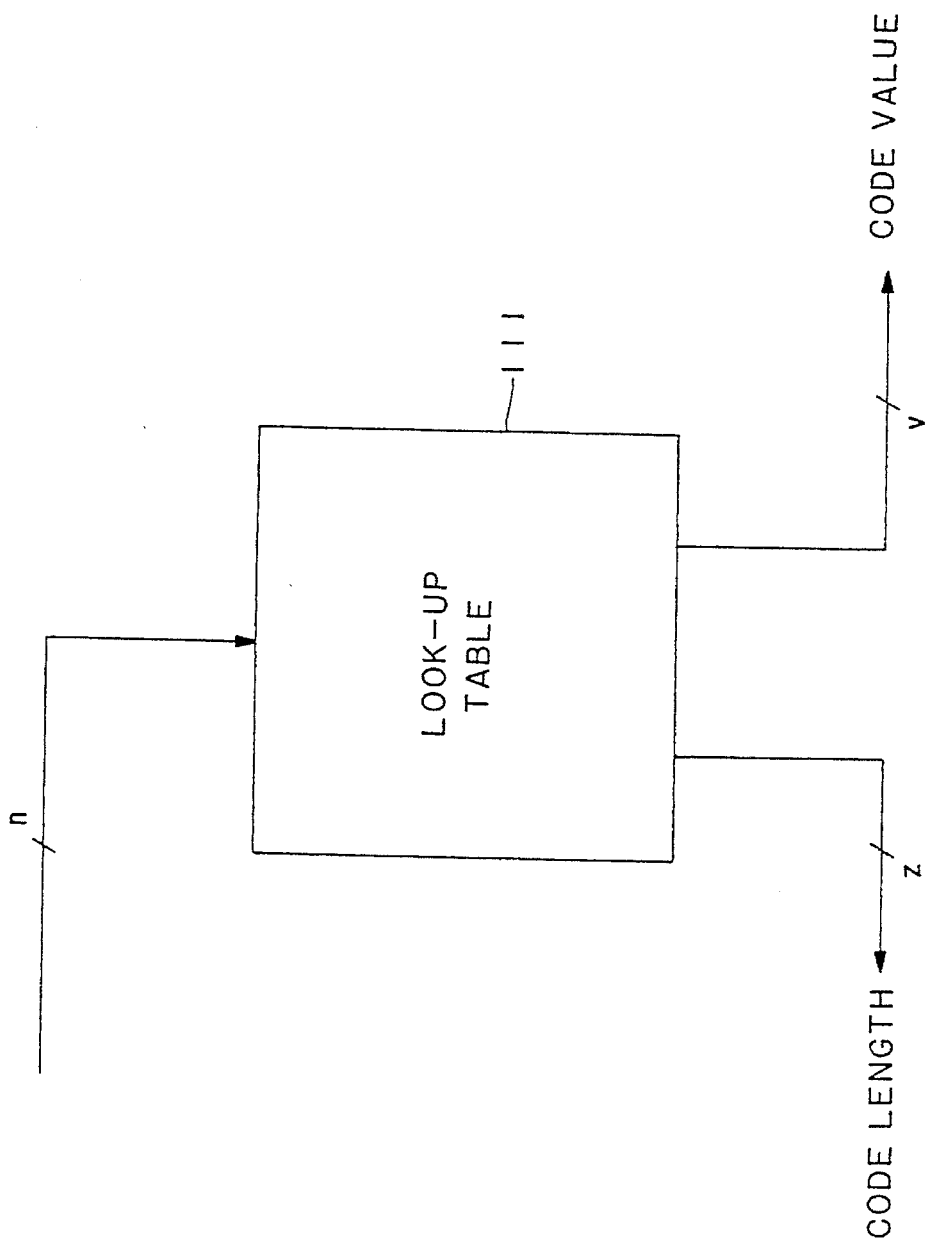
FIG. 11 is a block diagram of a prior art variable length decoder for decoding variable length codes.

To illustrate the reduction in memory, consider the prior art shown in FIG. 11 where a separate code length table is not used. The memory size for the prior art device is $2^n*(z+v)$.

The memory size for the exemplary embodiment shown in FIG. 12 is the memory size, $2^{(n-j)}*z$, of the code length LUT+the memory size, $2^n*v$, of the code value LUT or $(2^{(n-j)})*z+(2^n*v)$. The reduction in memory size is calculated as $(2^n*(z+v))-((2^{(n-j)})* z+(2^n*v))$ which is equal to $z*2^n*(1-2^{-j})$. Thus, a reduction in memory of $z*2^n*(1-2^{-j})$ is realized.

Fourth Exemplary Embodiment

The fourth exemplary embodiment is an MPEG decoder which is described with reference to FIG. 8. According to the fourth exemplary embodiment, a separate code length table is used to determine the code length of the variable length code and to decode the variable length code.

Figure 8:
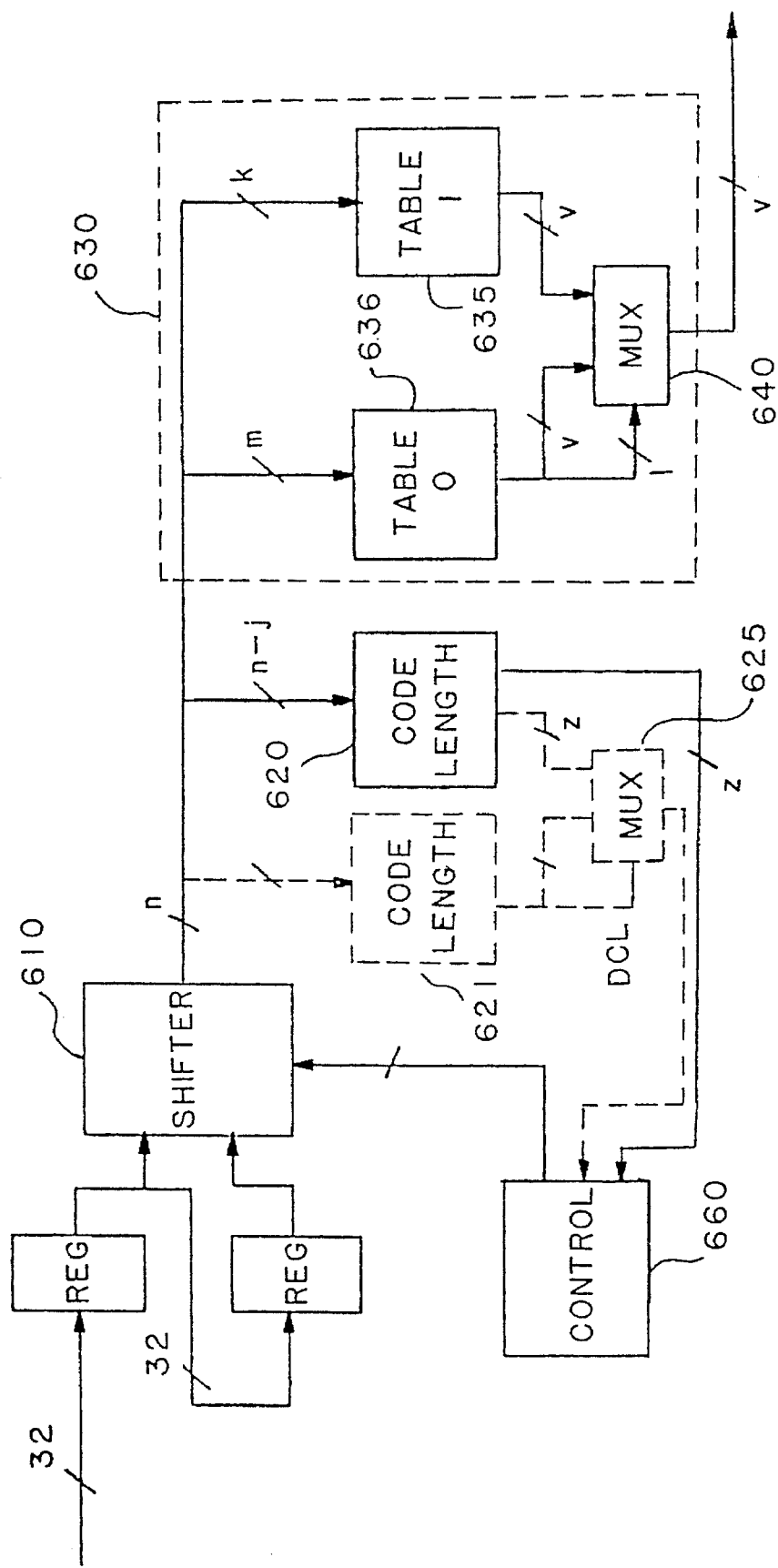
FIG. 8 is a block diagram of a variable length decoder for decoding MPEG variable length codes according to the fourth exemplary embodiment of the present invention.

As shown in FIG. 8, shifter 610 is connected to a 32 bit input stream. The output of shifter 610 is coupled to code length table 620 through a n–j parallel bit stream and to variable code length table 630 through an n parallel bit stream. Shifter 610 is also coupled to control circuitry 660 which is in turn coupled to code length table 620.

Code length table may also be divided into two tables as indicated by the dashed lines for CDL 621 and multiplexer 622. The code length table may be divided into two tables using the method described in the first exemplary embodiment.

Variable length table 230 includes two LUTs 635, 636 coupled to multiplexer 640. LUTs 635, 636 receive m and k parallel bit streams from shifter 610 respectively.

If the fourth exemplary embodiment of this invention is used to decode the VLC described above with regard to Tables Three and Four, the values n, n−j, m and k may be set equal to 17, 11, 9 and 11 respectively.

In operation, shifter 610 receives a 64-bit parallel segment of the bit stream. The 64 bit segment received by shifter 610 includes several variable length code values.

A programmable segment of the bit stream is provided by the shifter 610 to variable length code word table 630 and to code length (CDL) table 620. An n-bit parallel segment of the bit stream is provided to variable length code table 630 to recover the code values from the variable length code from the bit stream. An (n−j)-bit wide parallel bit stream is applied to code length table 620 to acquire the code length.

As described below, the code length is used to separate the variable length encoded value from the subsequent variable length encoded values in the continuous bit stream. Accordingly, the variable length encoded value does not need to be immediately decoded because the subsequent variable encoded value may be identified in the bit stream using the acquired code length.

Further, as described in the third exemplary embodiment, by using a separate code length table, it is possible to reduce the overall size of the memory required for decoding the variable length code. This results because the table does not have to include both the decoded variable length code value and its corresponding length value. Thus, the amount of bits stored in the table at an address may be reduced.

Once code length table 620 has decoded the code length, the decoded code length is provided to control circuitry 660. The code length table uses the (n−j) bits as an address in memory. The data contained at the address in memory is supplied by the code length table 620 to control circuitry 660. Control circuitry 660 uses the code length value to determine the number of bits in the variable length code value at the start of the segment of the data stream being provided by shifter 610. Accordingly, control circuitry 660 controls shifter 610 in response to the code length to provide a subsequent segment of the bit stream immediately after the variable length code vale that has been provided.

For example, if the variable length code is two bits in length, the code control circuitry 660 causes shifter 610 to provide a subsequent segment which starts immediately after the two-bit variable length code as the next output value of shifter 610.

As a consequence, control circuitry 660 can identify the start of the next series of bits regardless of whether the variable length table 630 has decoded the code value.

In addition, CDL 620 may be divided into two CDLs 620 and 621 which provide outputs to multiplexer 625. The CDL may be divided into smaller CDLs using the method described in the first exemplary embodiment. The operation of the two CDLs 602, 621 and multiplexer 625 would also be similar to the tables described in the first exemplary embodiment.

Variable length table 620 uses a method similar to that described in the first exemplary embodiment to decode the variable length code. As a result of using both code length table 620 and variable length table 630 to decode code length and the variable length code word respectively, it is possible to operate the decoding system at a high rate of speed while also reducing the required memory used for look up tables to decode encoded values. Further, the decoding apparatus may be prepared to receive the next segment of bits and process those bits without waiting for all of the previous data in the previous segment of bits to be decoded.

To illustrate the reduction in memory, consider the case where separate code length tables and parallel LUTs are not used as shown in FIG. 11. The table memory size would be $2^n*(z+v)$. In contrast, for the fourth exemplary embodiment employing separate code length table and separate LUTs for obtaining the code value, the total size of the tables would be $z*(2^m+2^k)+v*2^{n-j}$. Thus, a reduction in the size of the tables can be realized.

The reduction is calculated as $2^n*(z+v)-[(2^m+2^k)*z+2^{n-j}*v]$ which is equal to $z*2^n(1-2^{m-n}-2^{k-})+v*2^n(1-2^{-j})$. Since m and k are less than n, then $2^n>=2^m+2^k$. Accordingly, the minimum memory reduction obtained is $z*2^n(1-2^{m-n}-2^{k-n})+v*2^n(1-2^{-j})$. In addition, as m and/or k are decreased in value, the reduction in memory size increases. For example, if the minimum table size from Table 3 is used, 9 and 11 for table zero 636 and table one 635 where n is 17 bits, and assuming (n−j) is equal 11, the total reduction in memory realized is $2^{17}*(1-2^{-8}-2^{-6})*z+2^{17}*(1-2^{-6})*v=(0.98046875*2^{17}*z)+(0.984375*2^{17}*v)$ or over 98% savings.

Alternatively, the first exemplary embodiment may be modified so that LUT zero 20 supplies the code length value of the variable length code to multiplexer 41. LUT zero 20 would also store the code length value in addition to the decoded variable length code value at an address corresponding to the m MSBs. Accordingly, LUT zero 20 supplies both the code length value and a decoded variable length code value to multiplexer 41.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A variable length decoder for decoding a specified number of variable length code values, at least one of the variable length code values being held in an n-bit fixed-length word, the fixed length word having k least significant bits and m most significant bits, m, n and k being integers and m and k each being less than n, the apparatus comprising:

first look-up table means for receiving only the m most significant bits and for producing a first decoded code value corresponding to the m most significant bits, where the first look-up table means decodes only a first limited number of the plurality of variable length code values which is less than the specified number of the plurality of variable length code values, the first look-up table means also for producing a conversion signal indicating that the first look-up table means has decoded the first decoded code value from the first limited number of the plurality of variable length code values;

second look-up table means for receiving only the k least significant bits and for producing a second decoded code corresponding to the least significant bits, where the second look-up table means decodes only a second limited number of the plurality of variable length code values which is less than the specified number of the plurality of variable length code values;

the first look-up table means and the second look-up table means decoding the m most significant bits and the k least significant bits at substantially the same time; and selector means for selecting one of the first decoded code and the second decoded code responsive to said conversion signal.

2. The variable length decoder as recited in claim 1, wherein the second look-up table means decodes the k least significant bits only using the k least significant bits.

3. The variable length decoder as recited in claim 1, wherein the first look-up table means includes a memory and the m most significant bits are used as an address for the memory.

4. The variable length decoder as recited in claim 3, wherein the first decoded code is stored at the address in the memory.

5. The variable length decoder as recited in claim 3, wherein the memory is one of a read only memory, a random access memory, and a logic circuit.

6. The variable length decoder according to claim 1, wherein the n-bit fixed-length word has a most significant bit and the at least one of the variable length code values has a most significant bit which is the same as the most significant bit of the n-bit fixed-length word.

7. A variable length decoder for decoding a specified number of variable length code values, at least one of the variable length code values being held in a n-bit fixed-length word, the fixed length word having k least significant bits and m most significant bits, m, n and k being integers and m and k being less than n, the apparatus comprising:

extracting means for extracting from the n-bit fixed length code the m most significant bits and the k least significant bits, the k least significant bits corresponding to a further fixed length code, the extracting means for extracting from the subsequent fixed length code further most significant bits and further least significant bits;

a plurality of look-up table means, wherein:

a) a first one of said plurality of look-up table means is for receiving only the m most significant bits and for producing a first decoded code corresponding to the m most significant bits, where the first one of said plurality of look-up table means decodes only a first limited number of the plurality of variable length code values which is less than the specified number of the plurality of variable length code values, the first look-up table means also for producing a conversion signal indicating that the first one of said plurality of look-up table means has decoded the first decoded code from the first limited number of the plurality of variable length code values;

b) a further one of said plurality of look-up tables for receiving only the further most significant bits and for producing a second decoded code corresponding to the further most significant bits, where the further one of said plurality of look-up table means decodes only a second limited number of the plurality of variable length code values which is less than the specified number of the plurality of variable length code values, the further one of said plurality of look-up tables also for producing a further conversion signal indicating that the further one of said plurality of look-up table means has decoded the second decoded code from the second limited number of the plurality of variable length code values;

c) a next further one of said plurality of look-up tables for receiving only the further least significant bits and for producing a third decoded code corresponding to the further least significant bits, where the next further one of said plurality of look-up table means decodes only a third limited number of the plurality of variable length code values which is less than the specified number of the plurality of variable length code values; and d) the plurality of look-up means decoding the variable length code values at substantially the same time; and selector means for selecting one of the first decoded code, the second decoded code, and the third decoded code based upon the conversion signal and the further conversion signal.

8. The variable length decoder as recited in claim 7, wherein the next further look-up means decodes the further least significant bits only using the further least significant bits.

9. The variable length decoder according to claim 7, wherein the n-bit fixed-length word has a most significant bit and the at least one of the variable length code values has a most significant bit which is the same as the most significant bit of the of the n-bit fixed-length word.

10. A method for decoding a specified number of variable length code values, at least one of the variable length code values being held in a n-bit fixed-length word, the fixed length word having k least significant bits and m most significant bits, m, n and k being integers and m+k being greater than or equal to n, the method comprising the steps of:

a) extracting from the fixed length word the k least significant bits and the m most significant bits;

b) decoding a first limited number of the plurality of variable length code values using only the m most significant bits to produce a first decoded code, where the first limited number is less than the specified number;

c) decoding a second limited number of the plurality of variable length code values using only the k least significant bits to produce a second decoded code, where the second limited number is less than the specified number and where steps b) and c) are performed at substantially the same time;

d) selecting one of the first decoded code and the second decoded code which corresponds to a decoding of the variable length code.

11. The method according to claim 10, wherein the n-bit fixed-length word has a most significant bit and the at least one of the variable length code values has a most significant bit which is the same as the most significant bit of the n-bit fixed-length word.

12. A method for decoding a variable length code value, the variable length code value being held in a n-bit fixed-length word, the fixed length word having k least significant bits and m most significant bits, m, n and k being integers and m+k being greater than or equal to n, the method comprising the steps of:

a) extracting from the fixed length word the k least significant bits and the m most significant bits, where step a) further comprises:

1) extracting from the n-bit fixed length word the m most significant bits;
2) extracting from the n-bit fixed length word the k least significant bits where k is less than or equal to m minus n;
3) determining if the variable length code can be decoded by separately using the m most significant bits and the k least significant bits to decode the variable length code;
4) repeating steps 2) and 3) and setting k=k+1, if the m most significant bits and the k least significant bits can not successfully decode the variable length code and if k is greater than 0;

b) separately decoding at substantially the same time the m most significant bits and the k least significant bits to produce a first decoded code and a second decoded code respectively;

c) selecting one of the first decoded code and the second decoded code which corresponds to a decoding of the variable length code.

* * * * *